United States Patent
Bisges

(10) Patent No.: US 9,112,107 B2
(45) Date of Patent: *Aug. 18, 2015

(54) THERMOGENERATOR

(75) Inventor: Michael Bisges, Sinzing (DE)

(73) Assignee: O-FLEXX TECHNOLOGIES GMBH, Duisburg (DE)

( * ) Notice: Subject to any disclaimer, the term of this patent is extended or adjusted under 35 U.S.C. 154(b) by 396 days.

This patent is subject to a terminal disclaimer.

(21) Appl. No.: 12/919,617

(22) PCT Filed: Feb. 12, 2009

(86) PCT No.: PCT/EP2009/051625
§ 371 (c)(1),
(2), (4) Date: Aug. 26, 2010

(87) PCT Pub. No.: WO2009/106431
PCT Pub. Date: Sep. 3, 2009

(65) Prior Publication Data
US 2011/0005562 A1   Jan. 13, 2011

(30) Foreign Application Priority Data

Feb. 29, 2008  (DE) .................. 10 2008 011 984

(51) Int. Cl.
*H01L 35/00* (2006.01)
*H01L 35/30* (2006.01)
*F24D 17/00* (2006.01)
*F24J 2/24* (2006.01)

(52) U.S. Cl.
CPC ............ *H01L 35/30* (2013.01); *F24D 17/0021* (2013.01); *F24D 2200/14* (2013.01); *F24H 2240/00* (2013.01); *F24H 2240/08* (2013.01); *F24J 2/24* (2013.01); *Y02B 10/20* (2013.01); *Y02B 10/70* (2013.01)

(58) Field of Classification Search
USPC ................. 136/200–242; 126/430, 443, 444
See application file for complete search history.

(56) References Cited

U.S. PATENT DOCUMENTS 4,012,920 A  *  3/1977  Kirschbaum .............. 62/235.1
4,063,546 A  *  12/1977  Schmid et al. ............. 126/610
4,251,291 A  *  2/1981  Gomez ....................... 136/206

(Continued)

FOREIGN PATENT DOCUMENTS

DE   35 14 490      10/1986
DE   37 04 559      8/1988

(Continued)

OTHER PUBLICATIONS

English translation of the International Preliminary Report on Patentability for international application PCT/EP2009/051625.

*Primary Examiner* — Allison Bourke
*Assistant Examiner* — Niki Bakhtiari
(74) *Attorney, Agent, or Firm* — Lucas & Mercanti, LLP

(57) ABSTRACT

A thermogenerator including several thermocouples that are electrically connected together. The thermocouples are arranged between one hot side of the thermogenerator receiving a thermal flow and a cold side that is arranged at a distance from the hot side. The thermoelectric generator that at least temporarily uses the fed thermal energy efficiently. The thermoelectric generator can be designed as a module including a collector for a thermal solar system and the thermal carrier medium flowing through the collector is guided, at least temporarily, to a thermoelectric generator by a heat exchanger.

12 Claims, 2 Drawing Sheets

(56) References Cited

U.S. PATENT DOCUMENTS

| | | | | |
|---|---|---|---|---|
| 4,292,579 | A | * | 9/1981 | Constant .................. 322/2 R |
| 4,497,973 | A | * | 2/1985 | Heath et al. ................. 136/212 |
| 4,969,956 | A | * | 11/1990 | Kreider et al. ............... 136/201 |
| 6,226,994 | B1 | * | 5/2001 | Yamada et al. ................ 62/3.7 |
| 6,857,425 | B2 | | 2/2005 | Flick |
| 2003/0196652 | A1 | | 10/2003 | Flick |

FOREIGN PATENT DOCUMENTS

| | | | |
|---|---|---|---|
| DE | 101 22 679 | | 12/2002 |
| DE | 195 37 121 | | 10/2003 |
| DE | 20 2005 002198 | | 4/2005 |
| DE | 10 2006 023616 | | 11/2007 |
| GB | 2172394 | * | 1/1986 |
| GB | 2 172 394 | | 9/1986 |
| WO | WO 80/01438 | | 7/1980 |

* cited by examiner

THERMOGENERATOR

PRIORITY CLAIM

This is a U.S. national stage of Application No. PCT/EP2009/051625, filed on Feb. 12, 2009, which claims priority to German Application No: 10 2008 011 984.9, filed: Feb. 29, 2008 the contents of which are incorporated herein by reference.

BACKGROUND OF THE INVENTION

1. Field of the Invention

The invention pertains to a thermogenerator with several thermoelectric pairs connected electrically to each other arranged between the hot side of the thermogenerator, which accepts the incoming heat, and a cold side of the thermogenerator arranged a distance away from the thermogenerator.

2. Related Art

A thermocouple operated as a thermogenerator produces electrical voltage on the basis of the Seebeck effect. In most cases, a relatively large number of pairs of thermorgenerator elements are connected together to form a thermocouple. The thermogenerator can comprise one or more thermocouples, which are connected electrically in series and/or in parallel. The thermoelectric voltage generated in the thermocouples is temperature-dependent and is in the range of a few microvolts. A few alloys have become widely accepted as thermoelectric pairs because of their properties at certain temperatures, and therefore a spectrum of thermoelectric material combinations (thermoelectric pairs) extending over a temperature range from −270° C. to 2600° C. has been developed. This spectrum is covered and defined by standards. The currently valid international standard for thermocouples is IEC 584-1, the counterpart to which in German-speaking countries is DIN EN 60584, Part 1. This standard defines 10 different thermoelectric material combination in terms of their properties:

| Type/Code Letter | Alloy |
|---|---|
| K | nickel-chromium/nickel-aluminum |
| T | copper/copper-nickel |
| J | iron/copper-nickel |
| N | nickel-chromium-silicon/nickel-silicon |
| E | nickel-chromium/copper-nickel |
| R | platinum-13% rhodium/platinum |
| S | platinum-10% rhodium/platinum |
| B | platinum-30% rhodium/platinum |

Another standard also used in Germany is DIN 43710, which defines thermoelectric types U and L. This standard is no longer valid.

| U | copper/copper-nickel |
|---|---|
| L | iron/copper-nickel |

In addition to the standardized thermoelectric pairs, there are also other combinations with special properties. Examples include the tungsten/tungsten-rhenium combination with possible temperature ranges up to 2600° C.

As conductive materials for the thermoelectric pairs of thermocouples, p-doped and n-doped semiconductor materials, usually bismuth-tellurite $Bi_2Te_3$ in particular, can also be considered. In addition, the p-doped and n-doped compounds listed in the following Tables 1.1 and 1.2 can be used:

TABLE 1.1

The p-type compounds with the best thermoelectric properties.

| T (K) | Compound, p-type | Z (1/K) |
|---|---|---|
| 225 | $CsBi_4Te_6$:$SbI_3$ (0.05%) | $3.5 \cdot 10^{-3}$ |
| 300 | $(Sb_2Te_3)_{72}(Bi_2Te_3)_{25}(S_2Se_3)_3$ | $3.4 \cdot 10^{-3}$ |
| 500 | $Tl_9BiTe_6$ | $2.3 \cdot 10^{-3}$ |
| 700 | $GeTe_{1-x}(AgSbTe_2)_x$ | $3.0 \cdot 10^{-3}$ |
| 1200 | $Si_{0.85}Ge_{0.15}$:B | $6.7 \cdot 10^{-4}$ |

TABLE 1.2

The n-type compounds with the best thermoelectric properties.

| T (K) | Compound, n-type | Z (1/K) |
|---|---|---|
| 80 | $Bi_{0.85}Sb_{0.15}$ | $6.5 \cdot 10^{-3}$ |
| 300 | $((Sb_2Te_3)_5Bi_2Te_3)_{90}(Sb_2Se_3)_5$ | $3.2 \cdot 10^{-3}$ |
| 450 | $Bi_2Te_{2.7}Se_{0.3}$ | $2.8 \cdot 10^{-3}$ |
| 800 | $Pb_{0.75}Sn_{0.25}Se$ | $>1.25 \cdot 10^{-3}$ |
| 1200 | $Si_{0.85}Ge_{0.15}$:P | $8.3 \cdot 10^{-4}$ |

A thermocouple operated as a thermogenerator normally comprises two thin heat-conducting plates, especially ceramic plates, between which alternating small squares of different conductive material, especially semiconductor material, are brazed in place. In each case, two different squares are connected to each other in such a way that they produce a series circuit. One of the two plates accepts the incoming heat flow (in the following also called the "hot side" of the thermocouple), whereas the other plate releases the outgoing heat flow (in the following also called the "cold side" of the thermocouple).

In addition to conventional thermocouples arranged between plates, it is also possible to use thin-film thermocouples in particular, such as those known by way of example from DE 101 22 679 A1. Thin-film thermocouples also have a hot side and a cold side.

The known thermoelectric generators are able to convert heat directly into electrical energy. The efficiency can be increased significantly in comparison with conventional thermocouples by using semiconductor materials in place of metals. Nevertheless, the thermogenerators available today have only a relatively low degree of efficiency; it is only a fraction (approximately 17%) of the Carnot efficiency.

A device for recovering electrical energy from solar radiation, furthermore, is known from DE 195 37 121 A1, wherein, in contrast to conventional photovoltaic systems, the solar radiation is not used directly. Instead, the radiation is converted into heat, which is then converted at a different location into electrical energy by Peltier elements in conjunction with a heat sink. The device comprises a collector for transferring the energy of the solar radiation to a first heat-transfer medium, and, in a location remote from the collector, a heat exchanger for transferring the heat from the first heat-transfer medium to the hot side of the Peltier elements, the cold side of which is connected to a heat sink.

A thermal solar collector is known from U.S. Pat. No. 6,857,425 B2, which comprises a collector plate, a first plate facing away from the solar radiation, and a support plate arranged between the other two plates and insulated on both sides; the support plate forms an upper channel and a lower channel for a heat-transfer medium circulated between the upper and lower channels. On one of the end surfaces of both the upper and lower channels there is a heat-conductive device, along which the heat-transfer medium flows. This device conducts the heat absorbed in the upper channel to a thermopile unit, which generates electricity from the heat. A heat exchanger is connected to the thermopile unit to carry heat away from the unit and thus to increase its efficiency. The heat that is carried away can be used, for example, to heat a building.

SUMMARY OF THE INVENTION

The invention is based on creating a thermoelectric generator that uses the heat of a solar thermal power system to generate power efficiently.

A thermoelectric generator is designed as a structural unit with a collector for a solar thermal power system and configured to supply, at least for certain periods of time, a heat-transfer medium flowing through the collector to the thermoelectric generator by way of a heat exchanger. As a result, it becomes possible to use the excess heat generated in the collector from solar radiation, especially the excess heat generated at very high outside temperatures, to produce power in the thermoelectric generator. Through the simultaneous generation of electrical and thermal energy, the efficiency of the thermoelectric generator is increased under conditions of intense solar radiation.

Solar power systems are called thermal systems when they make use of the heat of solar radiation (solar thermal energy). To recover heat, an absorber of a thermal collector is heated by the energy of the sun. A heat-transfer medium absorbs the heat as it flows through the collector. A pump conveys the heat-transfer medium around a solar circuit, along the course of which the heat is carried from the collector to a heat sink, especially a solar heat reservoir; the solar heat reservoir accepts the heat and stores it.

The collector is the part of the solar power system that absorbs the heat of the sun and transfers the absorbed heat to the heat-transfer medium in the solar circuit with the least possible loss. The main difference between collectors, with respect to their structural design, is between flat collectors and tubular collectors. Flat and tubular collectors differ technically with respect to the insulation of the absorber. The insulating effect in the case of vacuum tube collectors is achieved by a vacuum in a glass tube, which completely suppresses the transport of heat by convection. Flat collectors make use of conventional insulating materials such as mineral wool or polyurethane foam. This insulation is less efficient than a vacuum, and therefore larger collector surface areas are required to achieve comparable performance values. Today's high-performance flat collectors work with a copper absorber. Because flat collectors are considerably less expensive, and therefore usually more economical than vacuum-tube collectors, this type of design is used almost exclusively in the residential area.

Solar heat reservoirs differ from conventional process water tanks primarily with respect to their very heavy insulation; the tall, slender shape of the water tank, which allows the formation of layers of different temperature (hot water at the top, cool water at the bottom); and a heat-transfer device with a large surface area installed at a low point for transferring the heat received from the solar circuit.

When a temperature in the collector rises above the temperature at the solar heat exchanger by a predetermined temperature difference, the pump is started by a control unit, and the heat is transported to the solar heat reservoir. When the temperature difference between collector and reservoir falls below the limit value, the system is stopped.

Standard commercial collectors can convert 60-70% of the solar energy arriving at the collector surface to usable heat. In these collectors, a mixture of water and polypropylene glycol, in a ratio of 60:40, is used as the heat-transfer medium. Through the addition of 40% propylene glycol, frost protection down to −23° C. is achieved; below that, freezing will occur but without frost shattering. In addition, a boiling temperature which can be 150° C. or more, depending on the pressure, is achieved. At higher temperatures, many collectors shut down and no longer deliver energy. When the system is idle, there is a danger of overheating and thus of damage to the solar thermal power system. In particular, the excess heat present at high temperatures can be used by the inventive thermoelectric generator, so that an inefficient idle state of the system can be avoided.

In one embodiment, a thermoelectric generator of the type described above in that a heat exchanger for a heat-transfer medium is arranged on the hot side of the thermoelectric generator, this heat exchanger being connected by one of its flat surfaces to the passive rear surface of a collector of a solar thermal power system through which the heat-transfer medium flows. A heat-insulating intermediate layer is present between the collector and the heat exchanger and, in at least one switching position of a valve control system, the flow of the heat-transfer medium through the heat exchanger is blocked.

Connecting the electrical thermogenerator to the collector of a solar thermal power system makes it possible to use the unused heat of the collector to generate energy in the thermogenerator, especially when the collector is idle.

The heat-insulating layer arranged between the collector and the heat exchanger reduces the exchange of thermal energy and almost completely prevents heat from being taken from the collector and sent to the thermogenerator during the working phase, when the maximum heat flow is to be supplied to a heat sink in the solar circuit. The heat-insulating layer preferably consists of insulating material, especially foamed plastic or mineral wool.

The term "collector" comprises an arrangement consisting of one or more solar collectors (e.g., flat collectors or tubular collectors), which can be connected to each other in series and/or in parallel.

The collector is connected to the heat sink by the solar circuit. Suitable heat sinks include in particular heat reservoirs, so that the heat taken up by the collectors can be used independently of the actual solar radiation. It is also conceivable, however, that the heat taken up by the collectors could be supplied directly via the solar circuit to a consumer acting as a heat sink.

The entire surface of the hot side of the thermogenerator receiving the incoming heat rests directly on the heat exchanger to improve the efficiency even further.

To increase the surface area of the cold side of the thermogenerator available to give up heat, the thermogenerator can comprise a cooling element, especially a cooling element with a finned structure. The fins of the finned structure are preferably perpendicular to the cold side. The improved heat dissipation provided by the fins increases the efficiency of the thermogenerator.

To carry excess heat away from the collector, a valve control system can connect the collector for certain periods of time to the heat exchanger, which is arranged on the hot side of the thermogenerator. The heat-transfer medium flows first through the collector and then through the heat exchanger, which transfers the excess heat to the hot side of the thermogenerator.

So that the heat-transfer medium can flow through the collector and the heat exchanger, the collector has a forward-flow connection and return-flow connection, and the heat exchanger has an inlet connection and an outlet connection.

The valve control system comprises at least one valve, preferably a multi-port valve, allows the heat-transfer medium coming from the collector to flow through the heat exchanger or prevents such flow, in that the valve, especially a multi-port valve, opens or closes the flow route from the forward-flow connection of the collector to the inlet connection of the heat exchanger. The flow route preferably comprises pipelines or hoses extending between the forward-flow connection of the collector and the inlet connection of the heat exchanger and the connections of the valve. Alternatively, the connections of the valve temporarily opening the flow route are connected directly to the forward-flow connection of the collector and the inlet connection of the heat exchanger.

At least one 3-way/2-way valve is installed in the forward-flow line to connect as desired the collector either to the heat exchanger in the solar circuit or to the heat exchanger on the hot side of the thermogenerator, wherein, in a first switching position of the 3-way/2-way valve, its connections open the flow route from the collector to the heat reservoir, whereas, in a second switching position of the 3-way/2-way valve, its connections open the flow route from the collector to the heat exchanger.

The flow route from the collector to the heat exchanger of the thermogenerator is opened especially when the heat reservoir has been completely heated and the solar thermal power system is in the idle state, the purpose of opening this route being to prevent overheating and thus damage to the collector and other parts of the solar thermal power system. Especially in the idle state, all of the heat is conducted from the collector to the heat exchanger and partially converted to electrical energy in the thermogenerator. While the heat reservoir is being heated, preferably no thermal energy is conducted to the thermogenerator.

The valves of the valve control system can be actuated by hand. Preferably the valves are electrically actuated multi-port valves or proportional valves, which are actuated by a control unit, which, on the basis of its measurement sensors, recognizes when the solar thermal power system is in the idle state or when there is an excess of heat in the collector or solar circuit, as a result of which it sends the switching command to the valves. For operations in the more complex hybrid mode, the control unit distributes the heat-transfer medium by way of the proportional valves as needed between the heat sink on the one side and the heat exchanger of the thermogenerator on the other under consideration of the outflow of heat from the heat reservoir and the intensity and duration of the solar radiation falling on the collector.

BRIEF DESCRIPTION OF DRAWINGS

The invention is explained in greater detail below on the basis of exemplary embodiments.

DETAILED DESCRIPTION OF THE DRAWINGS

Figure 1A:
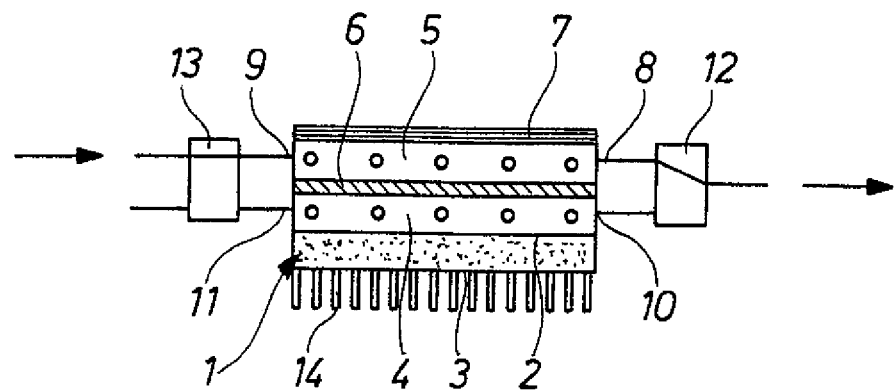
FIG. 1a is an exemplary embodiment of a thermogenerator in a first operating mode.

FIG. 1a shows a thermogenerator 1, comprising several electrically connected thermoelectric pairs, which are arranged between a hot side 2 of the thermogenerator 1, which accepts the incoming heat, and a cold side 3 of the thermogenerator 1. A heat exchanger 4, preferably in the form of a tubular heat exchanger, is arranged on the hot side 2. The heat exchanger 4 is connected by one of its flat surfaces to the passive rear surface of a collector 5 of a solar thermal power system. Between the collector 5 and the heat exchanger 4, a thermally insulating intermediate layer 6 is provided to thermally isolate the components from each other.

In the exemplary embodiment shown here, the collector 5 is a tubular collector, which is in particular a part of the solar power system shown by way of example in FIG. 2, which will be explained further below. For the recovery of heat, the absorber 7, which is mounted on top of the collector 5, is heated by solar energy. A heat-transfer medium, which absorbs the heat, flows through the collector 5. A pump (e.g., pump 21, FIG. 2) conveys the heat-transfer medium around a solar circuit and sends it to a heat sink, especially a solar heat reservoir, which accepts the heat and stores it.

The collector 5 has a forward-flow connection 8, to which a piping system for the heat-transfer medium heated by the solar radiation is connected. On the opposite side is the return-flow connection 9 of the collector 5. The heat exchanger 4 also has two connections, namely, an inlet connection 10 and an outlet connection 11. The thermogenerator in the exemplary embodiment shown here comprises a valve control system with two multi-port valves 12, 13. The multi-port valve 12 is a 3-way/2-way valve. The multi-port valve 13 is a 4-way/2-way valve.

In the switching position of the two multi-port valves 12, 13 shown in FIG. 1a, the heat-transfer medium is free to flow through the collector 5 but is blocked from flowing through the heat exchanger 4. If the return-flow connection 9 is connected by the valve 13 to, for example, an additional thermal collector of a solar power system, all of the heat absorbed there and all of the heat absorbed by the collector 5 are sent via the multi-port valve 12 to a heat sink, especially to a heat reservoir 17 of a solar power system. This operating mode, shown in FIG. 1a, is selected when a temperature in the collector 5 and in the upstream thermal collector is above the temperature in the heat reservoir and the reservoir 17 has not yet reached its full heat storage capacity.

Figure 1B:
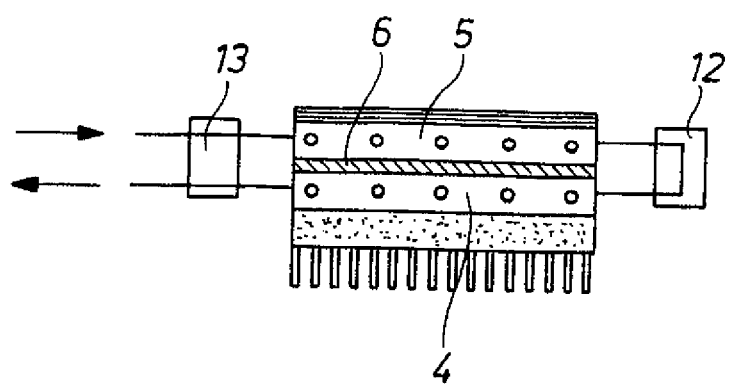
FIG. 1b is the thermogenerator of FIG. 1a in a second operating mode.

If, however, the heat reservoir has reached its full heat storage capacity or if no heat is needed at the heat sink downstream from the collector 5, the thermogenerator 1 enters the operating mode shown in FIG. 1b. The heat-transfer medium coming from the thermal collectors and thus already heated is conducted via the return-flow connection 9 through the collector 5 and the multi-port valve 12 into the heat exchanger 4, which transfers the excess heat to the hot side 2 of the thermogenerator 1, where the heat is converted to electrical energy. To increase the efficiency of this energy conversion, a cooling element 14 is arranged on the cold side 3 of the thermogenerator 1. The outlet connection 11 of the heat exchanger 4 leads to the solar heat reservoir 17.

Especially because of the cooling of the heat-transfer medium as it passes through the heat exchanger 4, the thermogenerator 1 makes it possible to prevent the solar power system from entering an undesirable idle state, and simultaneously the excess energy leading to the idling of the thermal collectors is converted to electrical energy.

Figure 2:
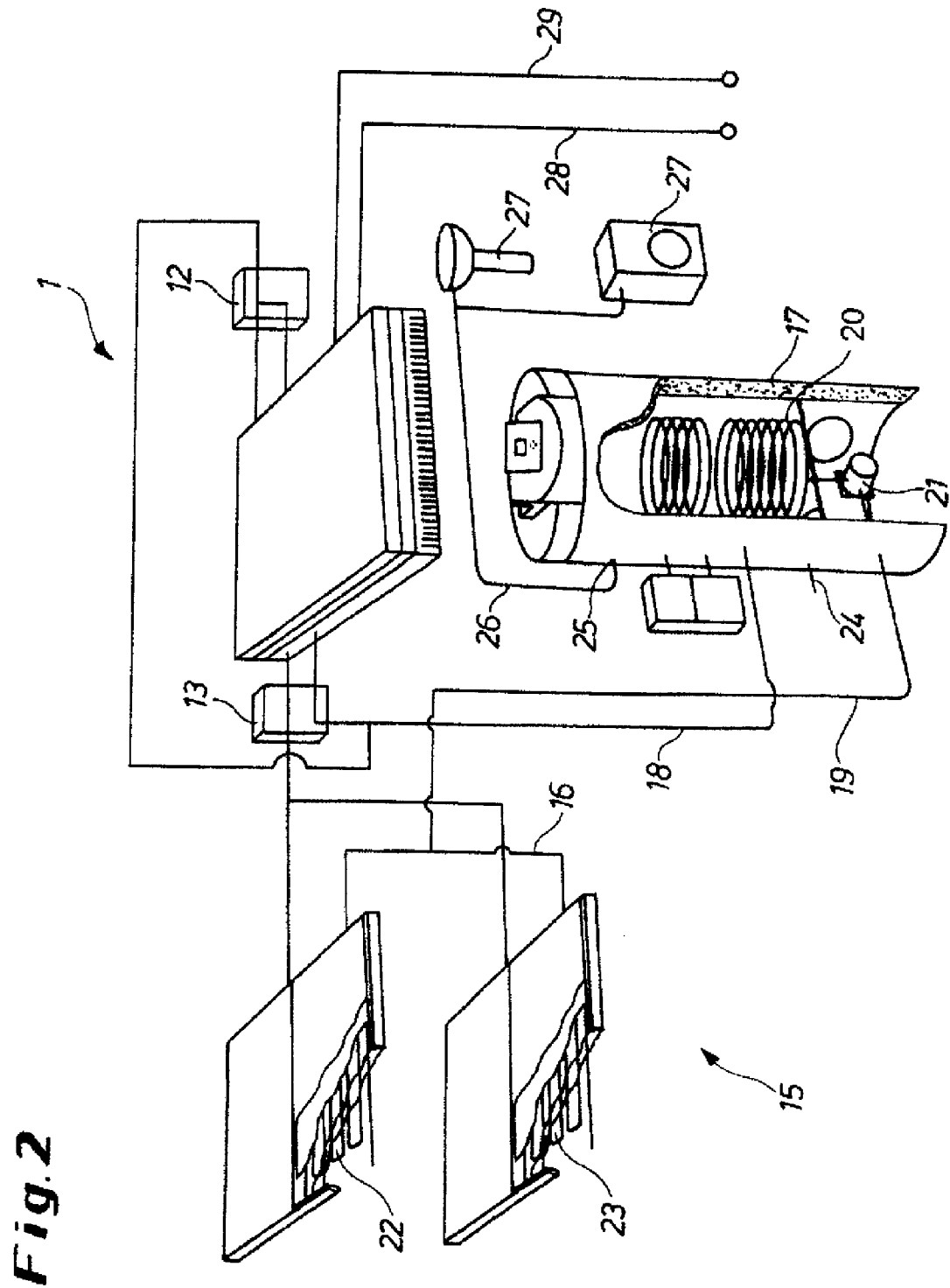
FIG. 2 is a thermogenerator integrated into a solar thermal power system.

FIG. 2 is a solar thermal power system 15 with an inventive thermogenerator 1 of FIG. 1a, 1b. The thermogenerator is connected by a solar circuit 16 to a heat reservoir 17. The solar circuit 16 consists of a forward-flow line 18, a return-flow line 19, and a tubular heat exchanger 20 arranged in the heat reservoir 17, which transfers the heat from the solar circuit 16 to the water in the heat reservoir 17. In addition, a pump 21, which pumps the heat-transfer medium through the solar circuit 16 including the two thermal collectors 22, 23 and the collector 5 and possibly the heat exchanger 4, installed at the end of the return-flow line 19.

The heat reservoir 17 is preferably designed as a hollow cylindrical solar tank. Water, which is supplied to the heat reservoir 17 through a feed line 24, is used as the storage medium. The tall, slender shape of the heat reservoir 17 makes it possible for different temperature layers to form. Hot water is present at the top of the heat reservoir 17, cooler water at the bottom. The discharge point 25 in the upper part of the container of the heat reservoir 17 is connected by pipelines 26 to the hot-water consumers 27.

The multi-port valves 12, 13 also shown in FIG. 2, are switchable to the positions shown in FIGS. 1a and 1b. After the heat reservoir 17 has been fully heated, however, it is also possible to allow the heat-transfer medium to flow exclusively through a circuit formed by the thermal collectors 22, 23, the collector 5, and the heat exchanger 4. In this case, an additional circulation pump is required. For this pure power generation mode of the thermogenerator 1, the heat of the thermal collectors 22, 23, which is used otherwise to heat the heat reservoir 17, is converted exclusively to electrical energy.

The thermogenerator 1 itself is connected by two terminals (not shown) to electrical lines 28, 29, over which the electrical energy is carried away from the thermoelectric generator 1.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A thermogenerator system, comprising:
    a collector of a solar thermal power system through which a heat transfer medium flows, the collector comprising an absorber to recover heat;
    a thermogenerator comprising a plurality of thermoelectric pairs electrically connected together and arranged between a hot side of the thermogenerator that accepts incoming heat and a cold side of the thermogenerator;
    a heat exchanger through which the heat-transfer medium flows having a first flat surface arranged on the hot side of the thermogenerator, a second flat surface of the heat exchanger being connected to a passive rear surface of the collector through a heat-insulating intermediate layer arranged between the collector and the heat exchanger; and
    a valve control system having at least one switching position configured to block a flow of the heat-transfer medium through the heat exchanger,
    wherein the collector, the intermediate layer, the heat exchanger, and the thermogenerator are arranged in order as a stack of components and connected to form a single structural unit, and
    wherein the collector, the intermediate layer, the heat exchanger, and the thermogenerator are arranged in order as the stack of components without intervening components.

2. The thermogenerator system according to claim 1, wherein the heat exchanger is plate-shaped.

3. The thermogenerator system according to claim 1, wherein the thermogenerator comprises at least one thin-film thermocouple.

4. The thermogenerator system according to claim 1, wherein the heat exchanger is one of a plate-type heat exchanger and a tubular heat exchanger.

5. The thermogenerator system according to claim 1, further comprising a cooling element arranged on the cold side of the thermogenerator.

6. The thermogenerator system according to claim 1, wherein the valve control system comprises at least one multi-port valve.

7. The thermogenerator system according to claim 6, wherein, in at least one switching position of the at least one multi-port valve, the collector is connected to the heat exchanger for a predetermined period of time.

8. The thermogenerator system according to claim 6, further comprising:
    a solar circuit comprising a forward-flow line and a return-flow line; and
    a heat sink connected to the collector by the solar circuit containing the heat-transfer medium, wherein the least one multi-port valve of the valve control system is installed in the forward-flow line, and wherein, the multi-port valve comprises:
        a first switching position configured to open a first flow route from the collector to the heat sink and,
        a second switching position configured to open a second flow route from the collector to the heat exchanger.

9. The thermogenerator system according to claim 2, wherein the thermogenerator comprises at least one thin-film thermocouple.

10. The thermogenerator system according to claim 1, wherein the valve control system is external to the single structural unit.

11. The thermogenerator system according to claim 1, wherein the collector has a return flow connection and a forward flow connection, and the heat exchanger has an inlet and an outlet, the valve control system being connected to the single structural unit via at least one of the return flow connection, the forward flow connection, the inlet, and the outlet.

12. The thermogenerator system according to claim 10, further comprising a solar circuit comprising a forward-flow line connected to the single structural unit and a return-flow line connected to the single structural unit; and
    a heat sink connected to the collector by the solar circuit containing the heat-transfer medium, wherein the valve control system is installed at least in the forward-flow line of the solar circuit.

* * * * *